(12) United States Patent
Stark et al.

(10) Patent No.: US 6,448,828 B2
(45) Date of Patent: *Sep. 10, 2002

(54) APPARATUS AND METHOD FOR EDGE BASED DUTY CYCLE CONVERSION

(75) Inventors: Donald C. Stark, Los Altos Hills; Stefanos Sidiropoulos, Palo Alto, both of CA (US)

(73) Assignee: Rambus Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/978,278

(22) Filed: Oct. 15, 2001

Related U.S. Application Data

(63) Continuation of application No. 09/513,721, filed on Feb. 24, 2000, now Pat. No. 6,323,706.

(51) Int. Cl.[7] .............................................. H03K 3/017
(52) U.S. Cl. ...................................... 327/175; 327/170
(58) Field of Search ................................ 327/170, 172, 327/173, 175, 24, 26, 215, 217, 233, 239, 259

(56) References Cited

U.S. PATENT DOCUMENTS

| | | | | |
|---|---|---|---|---|
| 4,583,008 A | * | 4/1986 | Grugett .......................... | 327/15 |
| 5,359,232 A | * | 10/1994 | Eitrheim et al. ............. | 327/116 |
| 5,614,855 A | * | 3/1997 | Lee et al. ..................... | 327/158 |
| 5,751,692 A | * | 5/1998 | Kiml ........................... | 370/85.1 |
| 5,777,500 A | * | 7/1998 | Eitrheim ...................... | 327/174 |
| 6,130,563 A | * | 10/2000 | Pilling et al. ................ | 327/111 |

* cited by examiner

*Primary Examiner*—Kenneth B. Wells
*Assistant Examiner*—Cassandra Cox
(74) *Attorney, Agent, or Firm*—Pennie & Edmonds LLP

(57) ABSTRACT

A duty cycle converter generating a pair of output signals whose cross-point duty cycle is substantially equal to the edge duty cycle of a pair of input signals. The duty cycle converter includes an edge detector and a signal generator. The edge detector detects and indicates a first transition of a first input signal and a second transition of a second input signal. The signal generator takes the outputs of the edge detector and generates a first output signal and a second output signal. The signal generator causes the cross-point duty cycle of the first output signal to substantially equal the edge duty cycle of the first input cycle. The signal generator does so by forcing a first time delay between adjacent crossover points of the first and second output signals to be substantially equal to a second time delay between the first transition and the second transition.

48 Claims, 8 Drawing Sheets

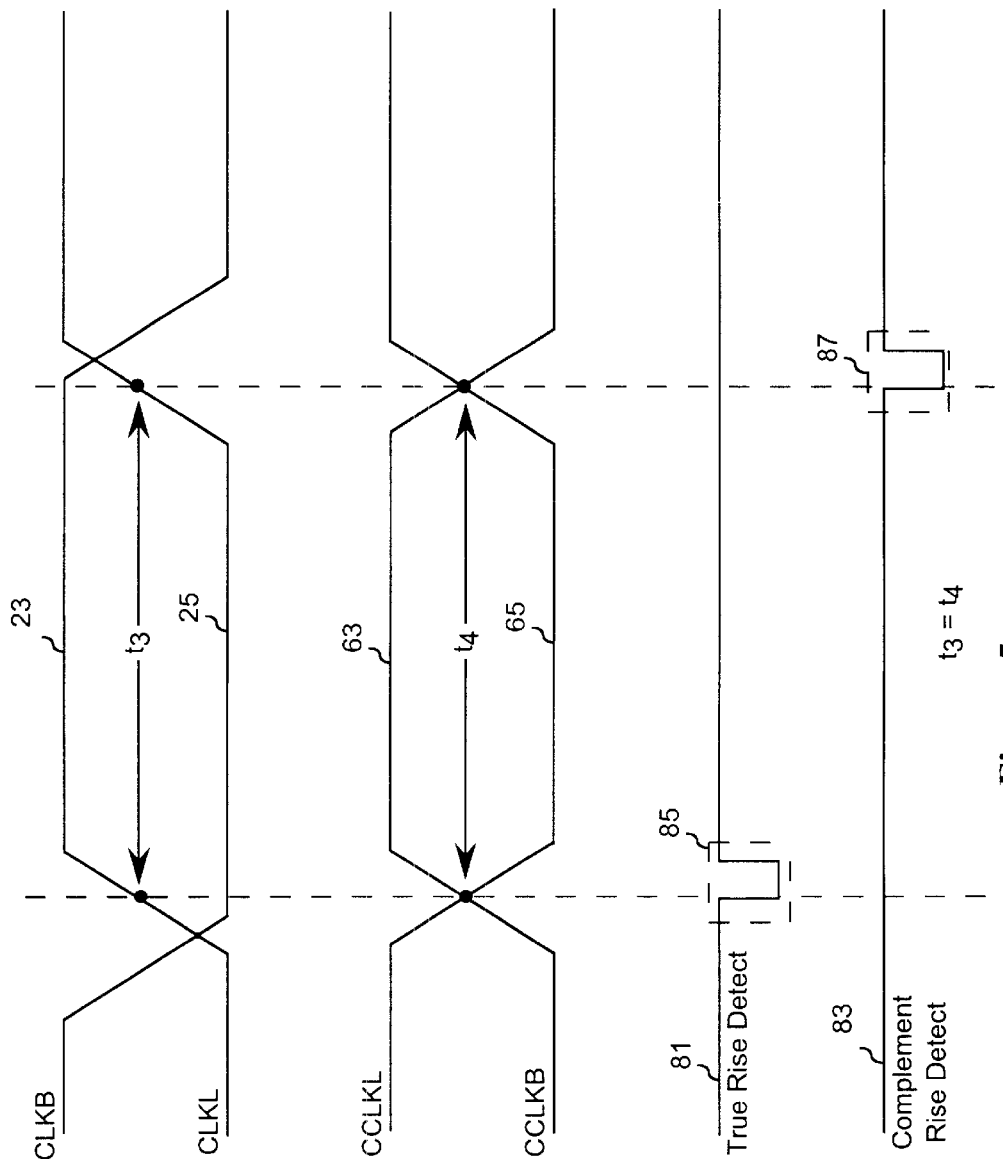

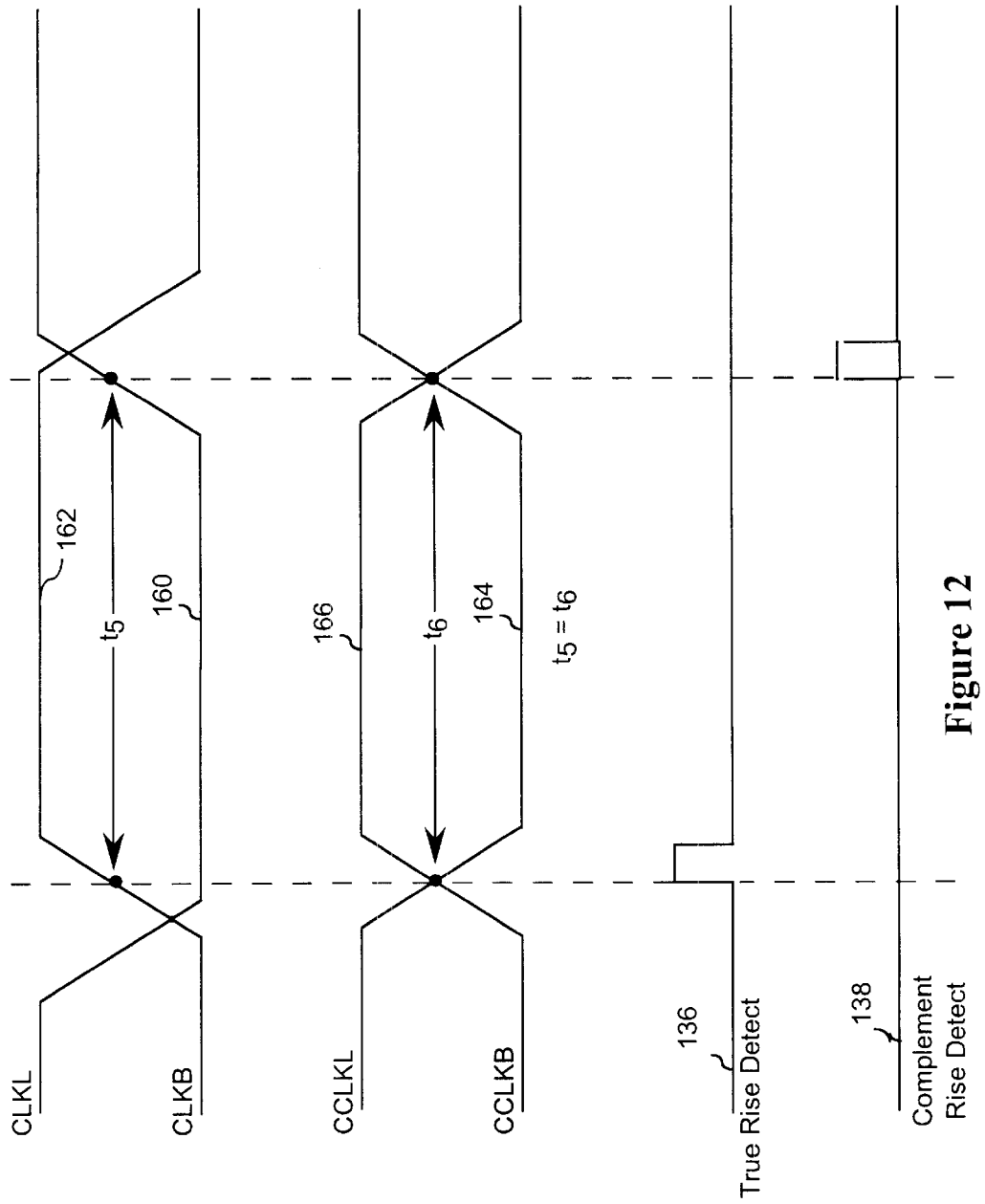

APPARATUS AND METHOD FOR EDGE BASED DUTY CYCLE CONVERSION

This application is a continuation of and claims priority on U.S. patent application Ser. No. 09/513,721, filed Feb. 24, 2000 U.S. Pat No. 6,323,706, which is hereby incorporated by reference in its entirety.

BRIEF DESCRIPTION OF THE INVENTION

The present invention relates generally to integrated circuits and more particularly to an apparatus for duty cycle conversion.

BACKGROUND OF THE INVENTION

Some integrated circuits decrease their associated delay times by doubling their data rates. Typically, to support data rate doubling a single phase clock input is split into true and complement clocks by a clock generator. These two internal clocks allow data sampling to occur on both the rising and falling edges of the single phase clock input. FIG. 1 illustrates a prior art Double Data Rate input Receiver (DRR) 26, which receives true and complement clocks from Clock Generator 20. From the single phase clock, the CLK signal, Clock Generator 20 generates the internal true and complement clock signals, which are labeled CLKL and CLKB, respectively. To promote satisfactory receive timing margins, the CLKL and CLKB signals should be 180° apart in phase. A Duty Cycle Correction Circuit may be used to force the CLKL and CLKB signals into this relationship.

FIG. 2 illustrates a prior art Duty Cycle Correction Circuit 30 coupled to a Clock Generator 20. The complementary clock signals, CLKL and CLKB, are input to the Duty Cycle Correction Circuit 30. Working in concert, Duty Cycle Correction Circuit 30 and Adjustor Circuit 40 set the duty cycle of the CLK signal such that the two cross points of the CLKL and CLKB signals are separated by half the cycle time. In contrast, DRR 26 is sensitive only to the rising edges of the CLKL and CLKB signals; for optimal timing, these rising edges should be separated in phase by 180 degrees. The DCCV and DCCVB signals allow Adjustor Circuit 40 to modify the duty cycle of the CLK signal. Measuring the differences between the CLKL and CLKB signals, the Duty Cycle Correction Circuit 30 is sensitive to the cross points of the CLKL and CLKB signals. In contrast, DRR 26 is sensitive only to the rising edges of the CLKL and CLKB signals. Thus, DRR 26 and Duty Cycle Correction Circuit (DCCC) 30 use different definitions of duty cycle.

FIG. 3 plots the CLKL and CLKB signals and indicates their duty cycles using a number of definitions. Generally, duty cycle is defined as a signal's high time divided by the sum of the signal's high and low time; i.e., the total cycle time. No disagreement exists as to what constitutes a signal's total cycle time; however, there are a number of competing definitions of cycle high time. In FIG. 3 "$t_1$" indicates the high time of the CLKL signal as the time between when the rising edge of the CLKL signal crosses the falling edge of the CLKB signal and when the falling edge of the CLKL signal intersects the rising edge of the CLKB signal. Thus, $t_1$ represents the cross-point high time to which the DCCC 30 is sensitive. In FIG. 3 "$t_2$" indicates the high time of the CLKL signal as the time from when the voltage of the rising edge of the CLKL signal exceeds a selected threshold level to when the voltage of the rising edge of the CLKB signal exceeds the selected threshold level. Thus, $t_2$ represents the rising edge high time to which the DRR 26 is sensitive. Within an integrated circuit using a DRR 26 and a Duty Cycle Correction Circuit 30 even a small difference between the cross-point high time and the rising edge high time substantially impacts receive time margins. Thus, a need exists for a converter circuit to generate a pair of signals whose cross-point duty cycle is equal to the midpoint duty cycle of the CLKL and CLKB signals. Inserted between a DRR 26 and a Duty Cycle Correction Circuit 30, such a converter circuit would improve receive time margins.

SUMMARY OF THE INVENTION

The apparatus of the present invention generates a pair of output signals whose cross-point duty cycle is substantially equal to the edge duty cycle of a pair of input signals. The apparatus of the present invention includes an edge detector and a signal generator. The edge detector detects and indicates a first transition of a first input signal and a second transition of a second input signal. The signal generator takes the outputs of the edge detector and generates a first output signal and a second output signal offset from the first output signal. The signal generator does so by forcing a first time delay between adjacent cross-over points of the first and second output signals to be substantially equal to a second time delay between the first transition and the second transition.

BRIEF DESCRIPTION OF THE DRAWINGS

Additional features of the invention will be more readily apparent from the following detailed description and appended claims when taken in conjunction with the drawings, in which:

FIG. 5 is a timing diagram of the input and output signals associated with the Duty Cycle Converter of FIG. 4.

FIG. 12 is a timing diagram of the input and output signals associated with the Duty Cycle Converter of FIG. 11.

DETAILED DESCRIPTION OF THE INVENTION

Figure 1:
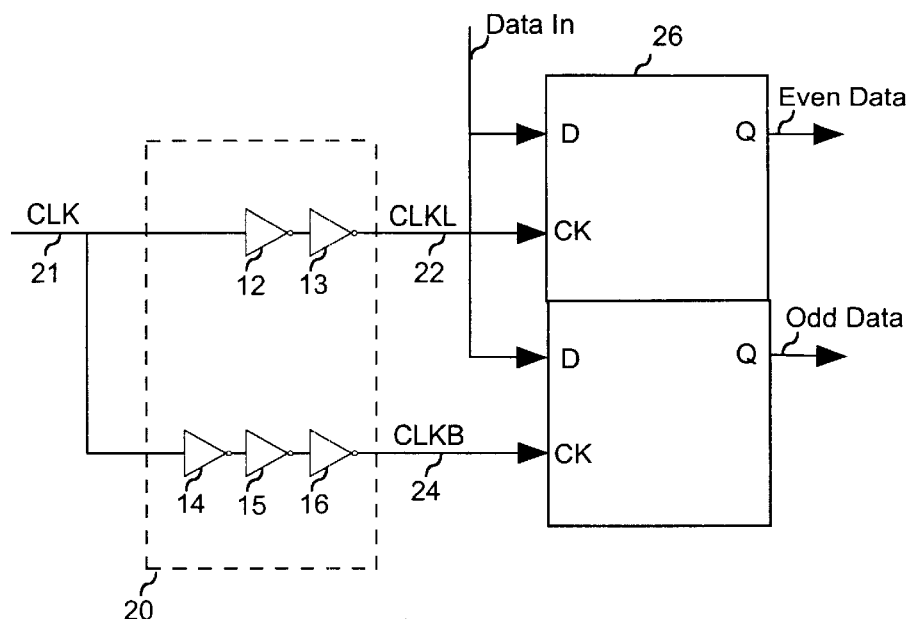
FIG. 1 illustrates a prior art Double Data Rate input Receiver (DRR).
Figure 2:
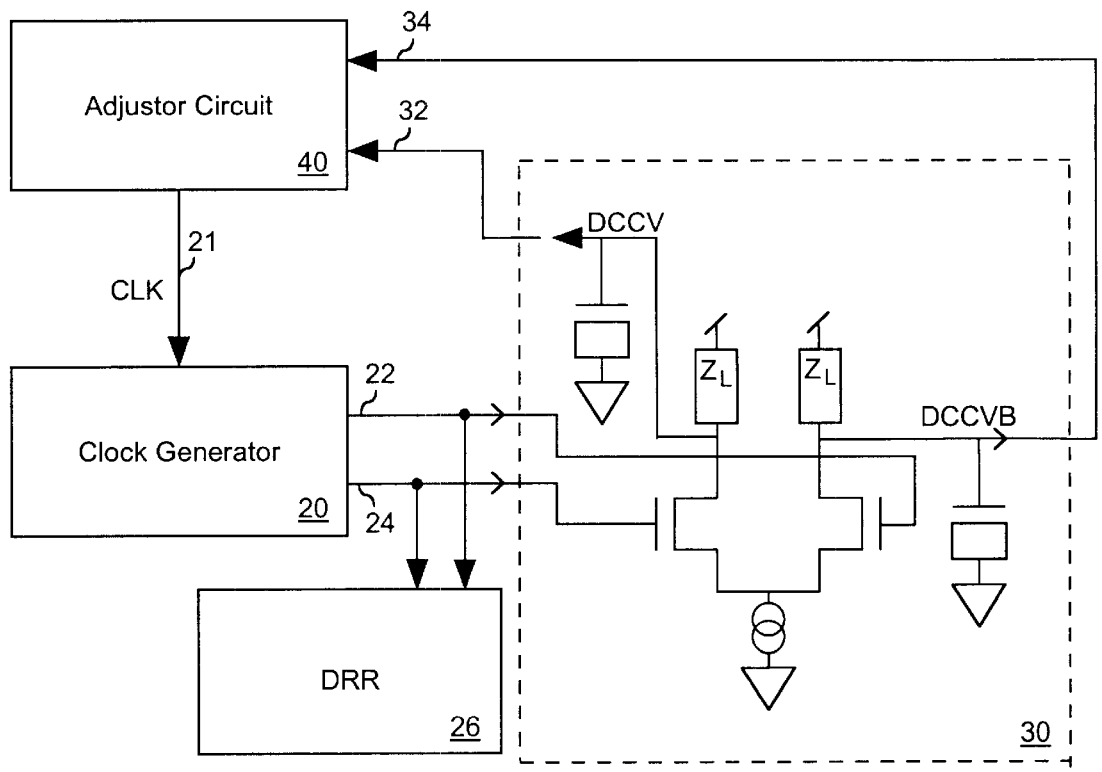
FIG. 2 illustrates a prior art Duty Cycle Correction Circuit coupled to a DRR.
Figure 3:
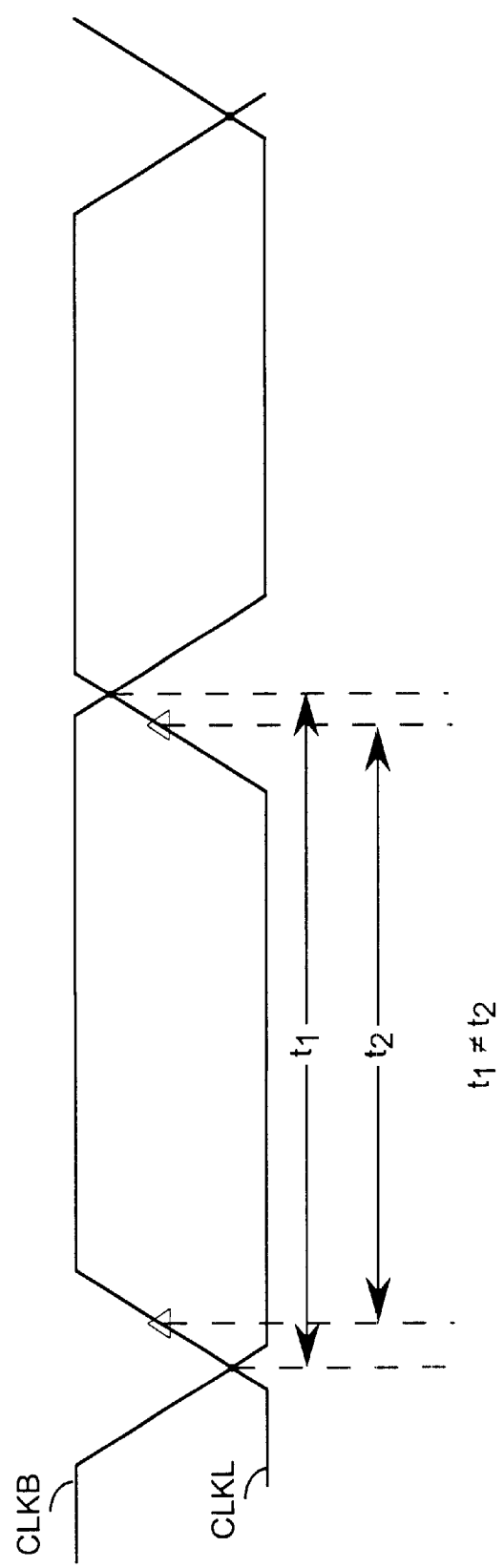
FIG. 3 plots the clock signals input to the DRR of FIG. 1 and indicates their duty cycles using a number of definitions.
Figure 4:
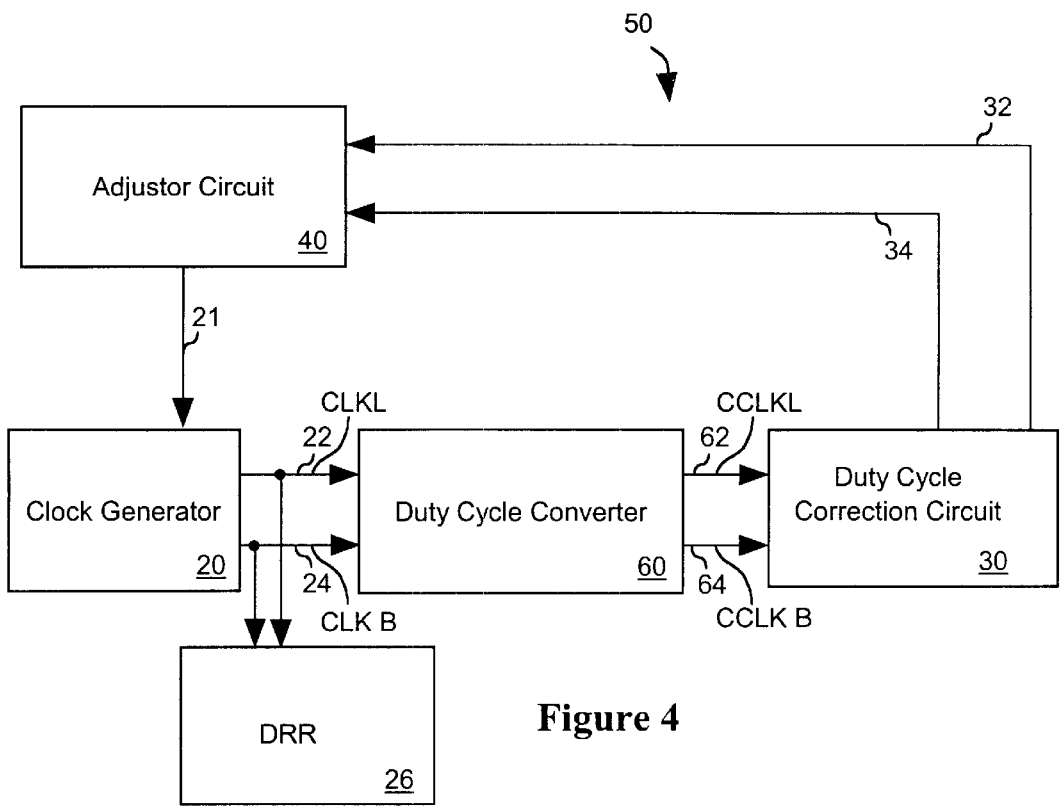
FIG. 4 illustrates an integrated circuit including the Duty Cycle Converter of the present invention.

FIG. 4 illustrates an Integrated Circuit 50 including the Duty Cycle Converter 60 of the present invention. Clock Generator 20 generates a true clock, the CLKL signal on line 22, and a complement clock, the CLKB signal on line 24, from a single phase clock, the CLK signal on line 21. Duty Cycle Converter 60, Duty Cycle Correction Circuit 30 and Adjustor Circuit 40 cooperate to bring to 180° the phase difference between the CLKL and CLKB signals, which are used to clock DRR 26. Duty Cycle Converter 60 receives the CLKL and CLKB signals and determines when their selected polarity transitions occur. The selected polarity transitions may be positive or negative. The time delay between the selected polarity transitions of the CLKL and CLKB signals are indicative of their selected polarity duty cycle. Duty Cycle Converter 60 uses these selected polarity transitions to generate a pair of output signals, the CCLKL and CCLKB signals, whose cross-points are substantially equal to the difference between the selected edge transitions of the CLKL and CLKB signals. Thus, Duty Cycle Converter 60 enables Duty Cycle Correction Circuit 30 and Adjustor Circuit 40 to offset the CLKB signal by 180° from the CLKL signal, thereby improving receive timing margins within Integrated Circuit 50. Receive timing margins may be improved by as much as 50 picoseconds using Duty Cycle Converter 60.

A. A Duty Cycle Converter Sensitive to Positive Polarity Transitions

FIG. 5 is a timing diagram of the input and output signals associated with a Duty Cycle Converter 60a sensitive to positive polarity transitions; i.e., rising edges. FIG. 5 shows the CLKL signal 23 on line 22 and the CLKB signal 25 on line 24. The FIG. also shows the CCLKL signal 63 output on line 62 and the CCLKB signal 65 on line 64. FIG. 5 illustrates that the time $t_3$ between the rising edge midpoints of the CLKL signal and the CLKB signal equals the time $t_4$ between adjacent cross-points of CCLKL signal 63 and CCLKB signal 65.

Figure 6:
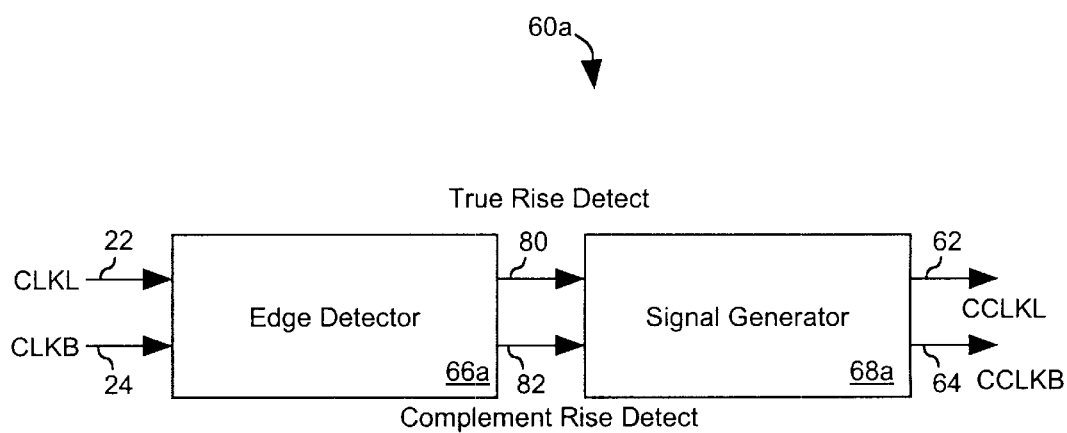
FIG. 6 illustrates in block diagram form an embodiment of the Duty Cycle Converter.

FIG. 6 illustrates in block diagram form a Duty Cycle Converter 60a sensitive to positive polarity transitions. Duty Cycle Converter 60 includes Edge Detector 66a and Signal Generator 68a. Edge Detector 66a receives as inputs the CLKL signal on line 22 and the CLKB signal on line 24. Edge Detector 66a detects the midpoint of the rising edges of the both the CLKL and CLKB signals and generates output signals indicating these events, which are coupled to Signal Generator 68a. Edge Detector 66a indicates the midpoint of the rising edge of the CLKL signal via the TrueRiseDetect signal on line 80. FIG. 5 illustrates the TrueRiseDetect signal as Waveform 81. Waveform 81 indicates the rising edge of the CLKL signal with pulse 85. Referring again to FIG. 6, Edge Detector 66a indicates the midpoint of the CLKB signal with the ComplementRiseDetect signal on line 82. FIG. 5 illustrates the ComplementRiseDetect signal via Waveform 83, which indicates the rising edge of the CLKB signal with pulse 87.

While an embodiment of Edge Detector 66 that is sensitive to the midpoints of rising edges of the CLKL and CLKB signals has been discussed, other embodiments are possible. Another embodiment of Edge Detector 66 sensitive to falling, rather than rising, edges of the CLKL and CLKB signals will be discussed below with respect to FIGS. 11–12. In yet another embodiment, Edge Detector 66 may be sensitive to voltage levels other than the midpoints of the CLKL and CLKB signals, for example, such as voltage levels representing 20% or 80% of the maximum voltage level of the CLKL and CLKB signals.

Referring to FIG. 6, Signal Generator 68a takes the TrueRiseDetect and ComplementRiseDetect signals and generates the CCLKL signal on line 62 and the CCLKB signal on line 64. Signal Generator 68a responds to the active state of the TrueRiseDetect signal by forcing the CCLKL signal to an active state and the CCLKB signal to an inactive state. FIG. 5 represents the active state as a high voltage level and the inactive state as a low voltage level; however, other voltage levels may be used to represent the active and inactive states consistent with the present invention.

Referring once again to FIG. 6, Signal Generator 68a responds to the active state of the ComplementRiseDetect signal by forcing the CCLKL signal to an inactive state and the CCLKB to an active state. By forcing both the CCLKL and CCLKB signals to transition between states at the same time, Signal Generator 68 forces the cross-point duty cycle of these signals to equal the rising edge duty cycle of the CLKL and the CLKB signals.

Figure 7:
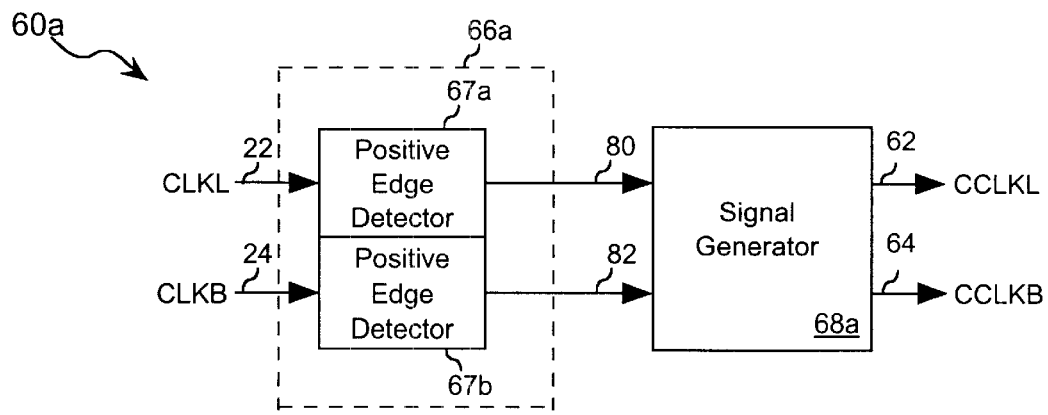
FIG. 7 illustrates an embodiment of the Edge Detector of the Duty Cycle Converter.

FIG. 7 illustrates an embodiment of Duty Cycle Converter 60a that realizes Edge Detector 66a as two Positive Edge Detectors 67a and 67b. Positive Edge Detector 67a recognizes the midpoint of the CLKL signal and in response generates the TrueRiseDetect signal on line 80. Positive Edge Detector 67b recognizes the midpoint of the CLKB signal and in response generates the ComplementRiseDetect signal on line 82.

Figure 8:
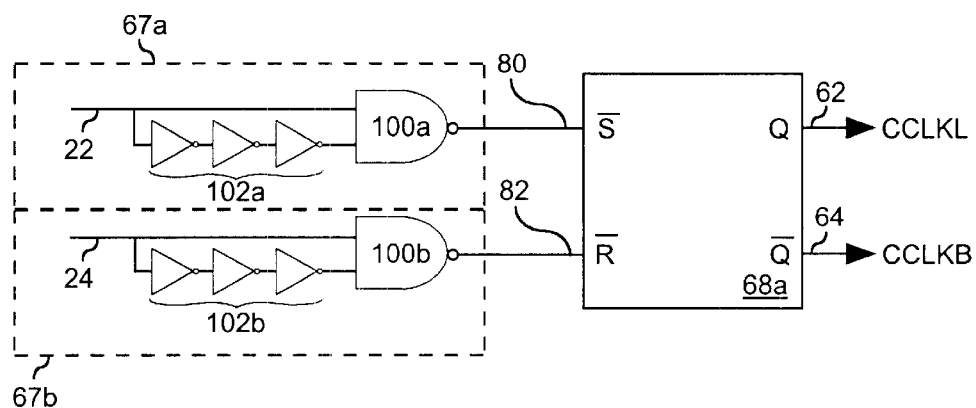
FIG. 8 illustrates an embodiment of the Signal Generator of FIG. 6.

FIG. 8 illustrates in greater detail the embodiment of Edge Detector 66a of FIG. 7. In the illustrated embodiment, each Positive Edge Detector 67a and 67b includes a logical NAND gate 100 and a group of serially coupled Inverters 102. Within Positive Edge Detector 67a, one input to logical NAND gate 100a is coupled directly to the CLKL signal. The CLKL signal is also input to the group of serially coupled Inverters 102a, the output of which is coupled to the other input of logical NAND gate 100a. Observe that prior to a digital low to high transition, serially coupled Inverters 102a apply a digital high value to one input node of logical NAND gate 100a. Therefore, the output of logical NAND gate 100a will go low when a digital high signal is received at the other input node of logical NAND gate 100a. Thus, Positive Edge Detector 100a responds to a selected point on the rising edge of the CLKL signal by pulsing low the TrueRiseDetect signal on line 80. The location of the selected point on the rising edge is a function of the threshold voltage, $V_{TH}$ of logical NAND gate 100a. Thus, control of $V_{TH}$ allows the selected point of the rising edge to be set at any desired percentage of the CLKL signal. The duration of the low pulse of TrueRiseDetect signal is determined by the number of inverters included within the group of serially coupled Inverters 102a. The total delay produced by the group of serially coupled Inverters 102a should be sufficient to cause Signal Generator 68 to change state. Positive Edge Detector 67b operates in a similar fashion, and is preferably matched, to Positive Edge Detector 67a.

Figure 9:
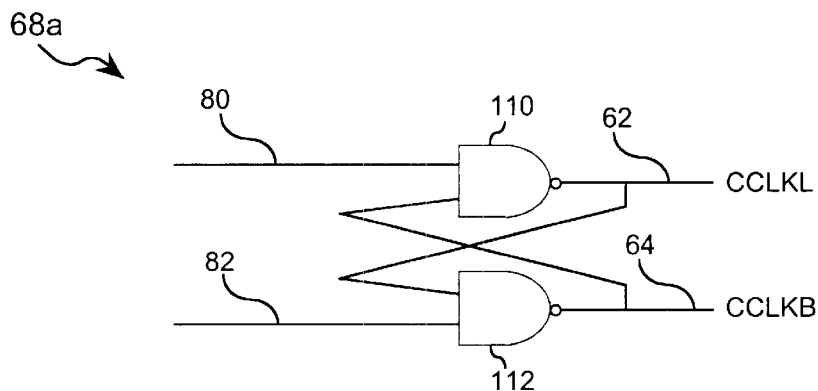
FIG. 9 illustrates schematically the embodiment of the Signal Generator of FIG. 8.

In the embodiment of FIG. 8, Signal Generator 68a is realized as a Set-Bar Reset-Bar (SBRB) Flip-Flop 68a. FIG. 9 illustrates schematically SBRB Flip-Flop 68a, which includes a pair of logical NAND gates 110 and 112, coupled together in the classic Flip-Flop configuration. One input of logical NAND gate 110 is coupled to the TrueRiseDetect signal on line 80, while the other input of logical NAND gate 110 is coupled to the output of logical NAND gate 112, on line 64. One input of logical NAND gate 112 is coupled to the ComplementRiseDetect signal on line 82, while the other input of the logical NAND gate 112 is coupled to the output of logical NAND gate 110. FIG. 5 illustrates the operation of SBRB Flip-Flip 68a, plotting both its input signals 81 and 83, and its output signals 63 and 65.

Figure 10:
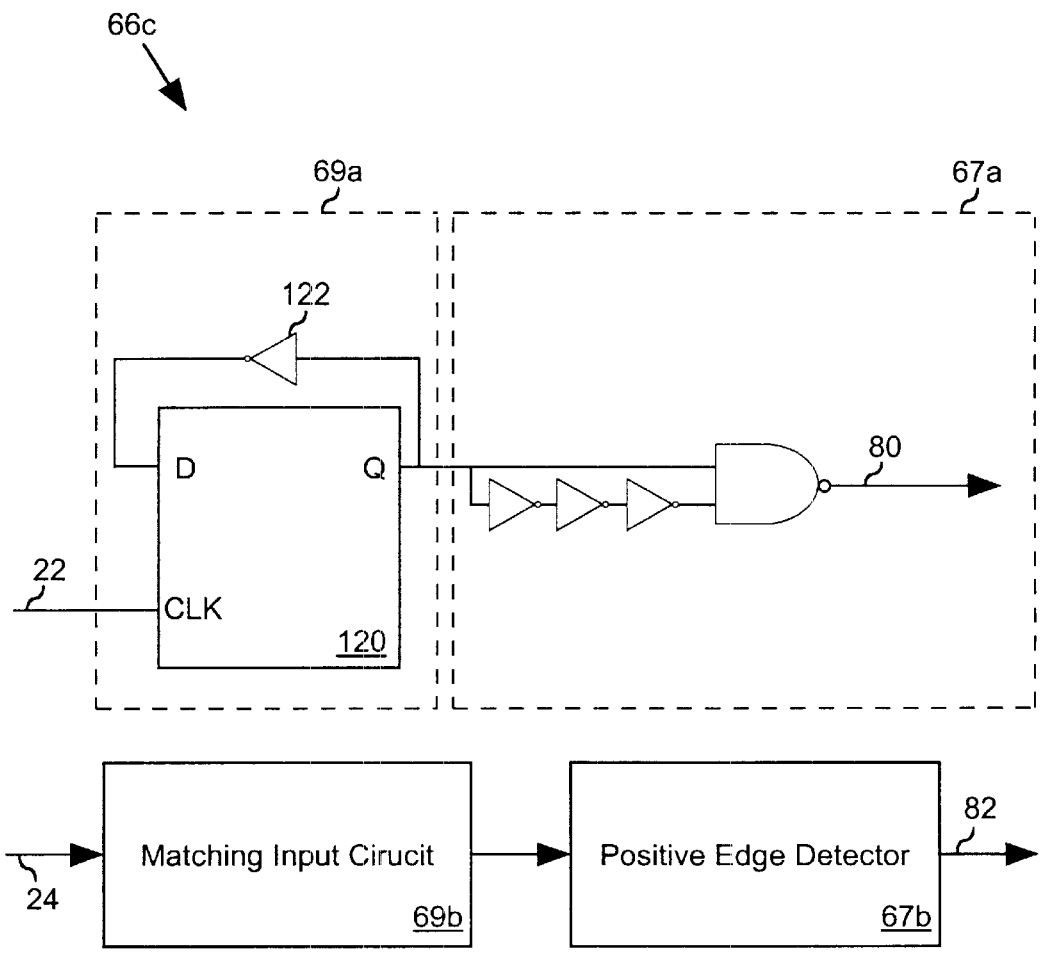
FIG. 10 illustrates another embodiment of Edge Detector of FIG. 6.

FIG. 10 illustrates another embodiment of Edge Detector 66a, which, in addition to Positive Edge Detectors 67a and 67b, includes Matching Input Circuits 69a and 69b. Inserted between an input signal and a Positive Edge Detector 67, each Matching Input Circuit 69 helps match the loads driven by the CLKL and CLKB signals, as well as matching the switching thresholds. Each Matching Input Circuit 69a and 69b is an identical DRR, which includes a D Flip-Flop (D-FF) 120 and an Inverter 122, coupled between the Q output and the D input of D-FF 120.

B. A Duty Cycle Converter Sensitive to Negative Polarity Transitions

Figure 11:
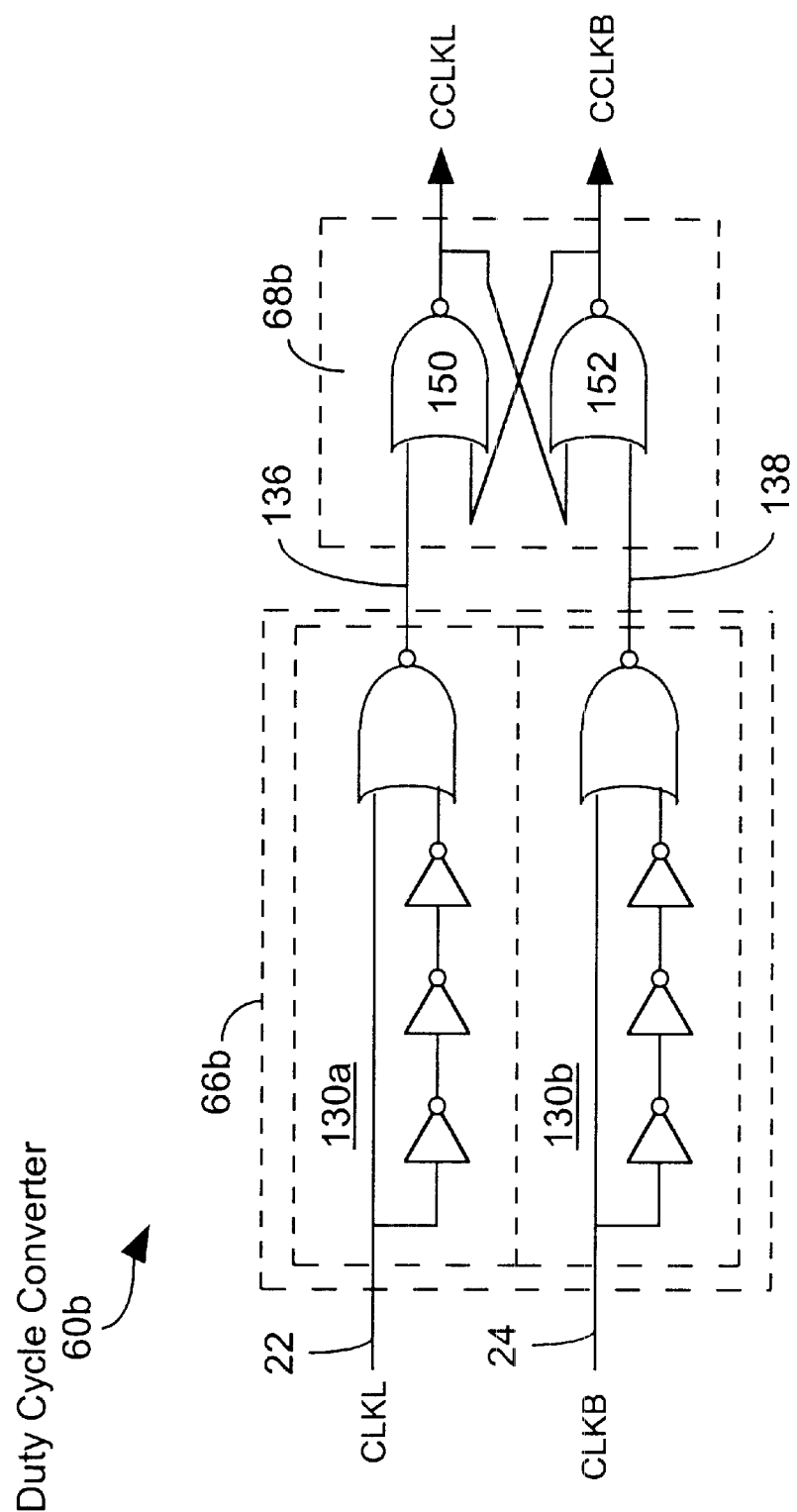
FIG. 11 illustrates an embodiment of a Duty Cycle Converter that is sensitive to negative polarity transitions.

FIG. 11 illustrates schematically Duty Cycle Converter 60b, which is sensitive to negative polarity transitions; i.e, falling edges. Duty Cycle Converter 60b includes Edge Detector 66b and Signal Generator 68b. Edge Detector 66b is realized as two Negative Edge Detectors 130a and 130b. Negative Edge Detector 130a recognizes the midpoint of the falling CLKL signal and in response generates the TrueRiseDetect signal on line 136. Negative Edge Detector 130b recognizes the midpoint of the falling CLKB signal and in response generates the ComplementRiseDetect signal on line 138. Each Negative Edge Detector 130 is realized as a group of serially coupled inverters an a logical NOR gate, coupled together in the same configuration as used in the Positive Edge Detectors. Signal Generator 68b is realized a pair of logical NOR gates 150 & 152, coupled together in the classic Flip-Flop configuration.

FIG. 12 is a timing diagram of the input and output signals associated with a Duty Cycle Converter 60b. FIG. 12 shows the CLKL signal 160 and the CLKB signal 162. The Figure also shows the CCLKL signal 164 and the CCLKB signal 166. Observe that the time $t_5$ between the falling edges of the CLKL signal 160 and CLKB signal 162 equals the time $t_6$ between adjacent cross-points of CCLKL signal 164 and CCLKB signal 166.

ALTERNATE EMBODIMENTS

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. An apparatus for duty cycle conversion comprising:
   an edge detector to detect a first transition of a first input signal and a second transition of a second input signal, the first and second input signals having an associated edge duty cycle, the first transition having a same polarity as the second transition; and
   a signal generator, coupled to the edge detector, to generate a first output signal and a second output signal offset from the first output signal, the first and second output signals having an associated cross-point duty cycle, the signal generator forcing a first time delay between adjacent cross-over points of the first and second output signals to substantially equal a second time delay between the first transition and the second transition, wherein the cross-point duty cycle of the first and second output signals is dependent upon the edge duty cycle of the first and second input signals.

2. The apparatus of claim 1 wherein the first and second input signals are complementary signals.

3. The apparatus of claim 1 wherein the first and second input signals are complementary clock signals.

4. The apparatus of claim 3 wherein the edge detector is responsive to positive transitions of the first input signal and second input signal.

5. The apparatus of claim 4 wherein the edge detector detects the first and second transitions using a threshold voltage level.

6. The apparatus of claim 5 wherein the threshold voltage level is a midpoint of the first input signal.

7. The apparatus of claim 1 wherein the edge detector comprises a first and a second edge detector circuit.

8. The apparatus of claim 7 wherein the first edge detector comprises:
   inverter circuitry having an input and an output, the input receiving the first input signal; and
   a NAND gate having a first input to receive the first input signal and a second input coupled to the output of the inverter circuitry.

9. The apparatus of claim 8 wherein the inverter circuitry comprises an odd number of serially coupled inverters.

10. The apparatus of claim 1 wherein the signal generator comprises a Set-Reset flip-flop.

11. An edge duty cycle to cross-point duty cycle converter comprising:
    a first edge detector detecting a first transition of a first input signal, the first input signal having a first duty cycle;
    a second edge detector detecting a second transition of a second input signal, the second transition having a same polarity as the first transition; the first and second input signals having an associated edge duty cycle; and
    a signal generator coupled to the first and second edge detectors to generate a first output signal and a second output signal offset from the first output signal, the first and second output signals having an associated cross-point duty cycle, the signal generator forcing a first time delay between adjacent cross-over points of the first and second output signals to substantially equal a second time delay between the first transition and the second transition, wherein the cross-point duty cycle of the first and second output signals is dependent upon the edge duty cycle of the first and second input signals.

12. The edge duty cycle to cross-point duty cycle converter of claim 11 the first and second input signals are complementary signals.

13. The edge duty cycle to cross-point duty cycle converter of claim 11 wherein the first and second input signals are complementary clock signals.

14. The edge duty cycle to cross-point duty cycle converter of claim 11 wherein the first edge detector comprises:
    a first inverter circuit having a first inverter input and a first inverter output, the first inverter input receiving the first input signal; and
    a first NAND gate having a first NAND input to receive the first input signal and a second NAND input coupled to the output of the first inverter circuit.

15. The edge duty cycle to cross-point duty cycle converter of claim 14 wherein the second edge detector comprises:
    a second inverter circuit having a second inverter input and a second inverter output, the second inverter input receiving the second input signal;
    a second NAND gate having a third NAND input to receive the second input signal and a fourth NAND input coupled to the output of the second inverter circuit.

16. The edge to cross-point duty cycle converter of claim 15 wherein the first inverter circuit comprises an odd number of inverters.

17. The edge to cross-point duty cycle converter of claim 15 wherein the second inverter circuit comprises an odd number of inverters.

18. The edge to cross-point duty cycle converter of claim 14 wherein the signal generator comprises a Set-Reset flip-flop.

19. The edge to cross-point duty cycle converter of claim 11 wherein the polarity of the first transition is positive.

20. The edge duty cycle to cross-point duty cycle converter of claim 11 wherein the first edge detector detects the first transition using a first threshold voltage level and wherein the second edge detector detects the second transition using a second threshold voltage level substantially equal to the first threshold voltage level.

21. The edge duty cycle to cross-point duty cycle converter of claim 11 wherein the first edge detector comprises:
   a third inverter circuit having a third inverter input and a third inverter output, the third inverter input receiving the first input signal;
   a first NOR gate having a first NOR input to receive the first input signal and a second NOR input coupled to the output of the third inverter circuit.

22. The edge duty cycle to cross-point duty cycle converter of claim 21 wherein the second edge detector comprises:
   a fourth inverter circuit having a fourth inverter input and a fourth inverter output, the fourth inverter input receiving the second input signal;
   a second NOR gate having a third NOR input to receive the second input signal and a fourth NOR input coupled to the output of the fourth inverter circuit.

23. The edge duty cycle to cross-point duty cycle converter of claim 22 wherein the third inverter circuit comprises an odd number of inverters.

24. The edge duty cycle to cross-point duty cycle converter of claim 22 wherein the fourth inverter circuit comprises an odd number of inverters.

25. The edge duty cycle to cross-point duty cycle converter of claim 21 wherein the signal generator comprises a Set-Reset flip-flop.

26. An apparatus comprising:
   a clock generator to generate first and second complementary clock signals having an associated edge duty cycle;
   a duty cycle converter, coupled to the clock generator, to convert the first and second clock signals into third and fourth complementary clock signals having an associated cross-point duty cycle, the duty cycle converter configured to force a first time delay between adjacent cross-over points of the third and fourth clock signals to substantially equal a second time delay between successive same polarity transitions of the first and second clock signals; and
   duty cycle correction circuitry, coupled between the duty cycle converter and the clock generator, to generate a clock control signal for input to the clock generator in response to the cross-point duty cycle of the third and fourth clock signals, the duty cycle correction circuitry adjusting the clock control signal so as to force same polarity edges of the first and second complementary clock signals to be separated by a predefined phase.

27. The apparatus of claim 26, wherein the clock control cycle is a fifth clock signal.

28. The apparatus of claim 26, wherein the predefined phase is 180 degrees.

29. The apparatus of claim 26, further including
   a circuit block, coupled to the clock generator to receive the first and second complementary clock signals, the circuit block utilizing the first and second complementary clock signals to perform a data communication task.

30. The apparatus of claim 29, wherein the circuit block includes a data receiver that uses the first and second complementary clock signals to control receipt of a data signal.

31. The apparatus of claim 26, wherein the duty cycle converter includes:
   an edge detector to detect a first transition of the first clock signal and a second transition of the second clock signal, the first transition having a same polarity as the second transition; and
   a signal generator, coupled to the edge detector, to generate the third clock signal and the clock fourth signal, offset from the third clock signal, the signal generator forcing a first time delay between adjacent cross-over points of the third and fourth clock signals to substantially equal a second time delay between the first transition and the second transition, wherein the cross-point duty cycle of the third and fourth clock signals is dependent upon the edge duty cycle of the first and second clock signals.

32. The apparatus of claim 31 wherein the edge detector detects the first and second transitions using a threshold voltage level.

33. The apparatus of claim 32 wherein the threshold voltage level is a midpoint of the first clock signal.

34. The apparatus of claim 31 wherein the edge detector comprises a first and a second edge detector circuit, and the first edge detector comprises:
   inverter circuitry having an input and an output, the input receiving the first clock signal; and
   a NAND gate having a first input to receive the first clock signal and a second input coupled to the output of the inverter circuitry.

35. The apparatus of claim 34 wherein the inverter circuitry comprises an odd number of serially coupled inverters.

36. The apparatus of claim 31 wherein the signal generator comprises a Set-Reset flip-flop.

37. A duty cycle conversion method comprising:
   detecting a first transition of a first input signal and a second transition of a second input signal, the first and second input signals having an associated edge duty cycle, the first transition having a same polarity as the second transition; and
   in response to detecting the first and second transitions, generating a first output signal and a second output signal offset from the first output signal, the first and second output signals having an associated cross-point duty cycle, including forcing a first time delay between adjacent cross-over points of the first and second output signals to substantially equal a second time delay between the first transition and the second transition, wherein the cross-point duty cycle of the first and second output signals is dependent upon the edge duty cycle of the first and second input signals.

38. The method of claim 37 wherein detecting the first transition comprises detecting a threshold voltage level of the first input signal.

39. The method of claim 38 wherein the threshold voltage level is a midpoint of the first input signal.

40. The method of claim 39 wherein the polarity of the first transition and the second transition is positive.

41. The method of claim 37 wherein the first and second input signals are complementary signals.

42. The method of claim 37 wherein the first and second input signals are complementary clock signals.

43. A signal generation method comprising:

generating first and second complementary clock signals having an associated edge duty cycle;

converting the first and second clock signals into third and fourth complementary clock signals having an associated cross-point duty cycle, including forcing a first time delay between adjacent cross-over points of the third and fourth clock signals to substantially equal a second time delay between successive same polarity transitions of the first and second clock signals; and generating a clock control signal, for controlling generation of the first and second complementary clock signals, in response to the cross-point duty cycle of the third and fourth clock signals, including adjusting the clock control signal so as to force same polarity edges of the first and second complementary clock signals to be separated by a predefined phase.

44. The method of claim 43, wherein the clock control signal is a fifth clock signal.

45. The method of claim 43, wherein the predefined phase is 180 degrees.

46. The method of claim 43, further including utilizing the first and second complementary clock signals to perform a data communication task.

47. The method of claim 43, further including utilizing the first and second complementary clock signals to control receipt of a data signal.

48. The method of claim 43, wherein the converting includes:

detecting a first transition of the first clock signal and a second transition of the second clock signal, the first transition having a same polarity as the second transition; and generating the third clock signal and the fourth clock signal, offset from the third clock signal, including forcing a first time delay between adjacent cross-over points of the third and fourth clock signals to substantially equal a second time delay between the first transition and the second transition, wherein the cross-point duty cycle of the third and fourth clock signals is dependent upon the edge duty cycle of the first and second clock signals.

* * * * *